US005668403A

United States Patent [19]
Kunikiyo

[11] Patent Number: 5,668,403
[45] Date of Patent: Sep. 16, 1997

[54] SEMICONDUCTOR DEVICE WITH REDUCED LEAKAGE CURRENT

[75] Inventor: Tatsuya Kunikiyo, Hyogo, Japan

[73] Assignee: Mitsubishi Denki Kabushiki Kaisha, Tokyo, Japan

[21] Appl. No.: 706,966

[22] Filed: Sep. 3, 1996

Related U.S. Application Data

[63] Continuation of Ser. No. 397,342, Mar. 2, 1995, abandoned.

[30] Foreign Application Priority Data

Jul. 29, 1994 [JP] Japan ................... 6-178408

[51] Int. Cl.$^6$ ........................... H01L 23/58
[52] U.S. Cl. ............. 257/639; 257/640; 257/649
[58] Field of Search ..................... 257/639, 640, 257/649

[56] References Cited

U.S. PATENT DOCUMENTS

| | | | |
|---|---|---|---|
| 4,462,847 | 7/1984 | Thompson et al. | 148/174 |
| 4,564,394 | 1/1986 | Bussmann. | |
| 4,907,063 | 3/1990 | Okada et al. | 357/54 |
| 5,236,862 | 8/1993 | Pfiester et al.. | |
| 5,256,593 | 10/1993 | Iwai | 437/70 |
| 5,316,965 | 5/1994 | Philipossian et al.. | |
| 5,358,893 | 10/1994 | Yang et al. | 437/70 |
| 5,387,540 | 2/1995 | Poon et al. | 437/67 |
| 5,429,995 | 7/1995 | Nishiyama et al. | 437/238 |
| 5,434,109 | 7/1995 | Geissler et al. | 437/239 |
| 5,521,120 | 5/1996 | Nulman et al. | 437/190 |

OTHER PUBLICATIONS

S. Wolf, "A Review of IC Isolation Technologies–Part 4" US–period.: Solid State Technology, Oct. 1992, pp. 53–61, (pp. 55 and 57 contain advertisements).

S. Ratanaphanyarat et al., "A Self–Aligned Nitrogen Implantation Process (SNIP) to Minimize Field Oxide Thinning Effect in Submicrometer LOCOS," US period. IEEE Transactions on Electron Devices, vol. 37, No. 9, Sep. 1990, pp. 1948–1958.

"Improved Hot–Carrier Immunity in CMOS Analog Device With $N_2$ O–Nitrided Gate Oxides", G.Q. Lo et al., IEEE Electron Device Letters, vol. 13, No. 9, Sep. 1992, pp. 457–459.

"Density Relaxation of Silicon Dioxide on (100) Silicon During Thermal Annealing", K. Taniguchi et al., J. Appl. Phys. 67 (5), Mar. 1, 1990, pp. 2195–2198.

Primary Examiner—Ngân V. Ngô
Attorney, Agent, or Firm—Lowe, Price, LeBlanc & Becker

[57] ABSTRACT

The present invention provides a method of manufacturing a semiconductor device improved so that stress at a boundary between a semiconductor substrate and an element isolation oxide film can be relaxed. In the method, the surface of a semiconductor substrate is oxidized with a nitride film used as a mask to form an element isolation oxide film in the surface of semiconductor substrate. After removing an underlay oxide film and nitride film, semiconductor substrate is heat-treated at a temperature of 950° C. or more. An element is formed in an element region.

7 Claims, 21 Drawing Sheets

SiOx

SiOxNy

SEMICONDUCTOR DEVICE WITH REDUCED LEAKAGE CURRENT

This application is a continuation of application Ser. No. 08/397,342 filed Mar. 2, 1995, now abandoned.

BACKGROUND OF THE INVENTION

1. Field of the Invention

The present invention generally relates to semiconductor devices, and more particularly, to a semiconductor device improved to enhance reliability. The present invention also relates to a method of manufacturing such a semiconductor device.

2. Description of the Background

In an ultra large scale integrated circuit (ULSI), a technique forming an element isolation oxide film isolating an element region from the other element regions is important. As miniaturization progresses, a technique for forming an element isolation oxide film without lowering integration density is required.

A method of forming a conventional element isolation oxide film will be described taking a method of manufacturing a conventional field effect transistor (MOSFET) as an example.

FIGS. 21 to 26 are sectional views schematically showing the steps of manufacturing the conventional MOSFET.

Referring to FIG. 21, an underlay oxide film 2 and a nitride film 3 are sequentially formed on a semiconductor substrate 1.

Referring to FIG. 22, underlay oxide film 2 and nitride film 3 are patterned so that an opening 4 can be formed on a portion at which an element isolation oxide film is to be formed.

Referring to FIG. 23, impurity ions 6 for forming a channel cut layer 5 are implanted into the surface of semiconductor substrate 1.

Referring to FIG. 24, the surface of semiconductor substrate 1 is oxidized with nitride film 3 used as a mask, thereby forming an element isolation oxide film 7 in the surface of semiconductor substrate 1. Referring to FIGS. 24 and 25, underlay oxide film 2 and nitride film 3 are removed. This method is called an LOCOS (Local Oxidation of Silicon) method.

Referring to FIG. 26, a field effect transistor (MOSFET) 8 is formed in an element region.

Description will now be given of problems of a method of manufacturing a conventional semiconductor device with the LOCOS method.

Referring to FIG. 27, the pattern of underlay oxide film 2 and nitride film 3 is formed on semiconductor substrate 1.

Referring to FIG. 28, with nitride film 3 used as a mask, the surface of semiconductor substrate 1 is thermally oxidized to form element isolation oxide film 7. A region in which element isolation oxide film 7 is formed is called a field region 105, and a region in which the MOSFET element is formed is called an element region 106. A bird's beak 9 extends from field region 105 to element region 106. Channel cut layer 5 formed under element isolation oxide film 7 is for electrical isolation between elements. A parasitic MOSFET exists in field region 105. In order to electrically isolate elements, the threshold voltage of the parasitic MOSFET must be increased so that it will not operate. For this purpose, channel cut layer 5 is provided.

In order to increase integration density, it is necessary to reduce the lateral length of field region 105. In order to reduce field region 105, it is necessary to reduce the lateral length of bird's beak 9. Bird's beak 9 becomes longer as the oxidation temperature is higher, and the thickness of nitride film 3 becomes smaller. Attempts to lower the oxidation temperature or to increase the thickness of nitride film 3 are made in order to shorten the length of bird's beak 9. However, these attempts do not result in extremely short bird's beak 9.

Referring to FIG. 28, when the semiconductor substrate is oxidized at a low temperature with nitride film 3 increased in thickness, an $SiO_x$ layer 10 is formed at a boundary between element isolation oxide film 7 and semiconductor substrate 1. Excessive interstitial silicon ($Si^+$) which is left unreacted at the time of oxidation reaction exists in $SiO_x$ layer 10, as shown in FIG. 29. If excessive interstitial silicon exists at high density in $SiO_x$ layer 10, stress concentrates in the surface of semiconductor substrate 1, causing lattice defects to be formed. In addition, a number of unsaturated bond hands of silicon atoms (Si—Si bond) in $SiO_x$ layer 10 cause trap. Such lattice defects and unsaturated bond hands of silicon atoms cause leakage current, preventing electrical isolation between elements. Since particularly large stress is applied to an end portion of element isolation oxide film 7, a number of small lattice defects are formed in this portion.

With miniaturization of the MOSFET element, the element isolation width decrease. Therefore, depending on the condition of an applied voltage of an element, electric field of approximately several hundred kV/cm is applied to field region 105. Since leakage current is more likely to occur than the conventional case, the above problems become more serious.

Besides the existence of lattice defects and unsaturated bond hands of silicon described above, a small defect also causes leakage current. The procedure of formation of such a small defect will be described. As a material of the ULSI, a semiconductor substrate of a silicon single crystal formed with a Czochralski pulling up process is used. Since the mechanical strength of the semiconductor substrate becomes stronger as the oxygen concentration in the substrate becomes higher, the silicon single crystal is formed such that oxygen atoms of $10^{18}/cm^3$ or more are included in the substrate. During the heat treatment for manufacturing the ULSI, however, oxygen which exists in the substrate at a high concentration precipitates, and the precipitated oxygen reacts with silicon to form $SiO_2$. Since the volume of the precipitates becomes approximately double at this time, silicon atoms are released in the place where the precipitates is generated, resulting in excessive interstitial silicon. The interstitial silicon atoms get together to form stacking faults or small defects such as dislocation.

The above problem also appears in a method of forming an element isolation oxide film using an SWAMI (Side Wall Masked Isolation) structure shown in FIGS. 30 to 35. In the LOCOS isolation method, bird's beak 9 was not made extremely short, and prevented integration. As measures against this, the SWAMI structure is proposed. Description will now be given of a process for forming the SWAMI structure.

Referring to FIG. 30, underlay oxide film 2 is formed on the surface of semiconductor substrate 1. Nitride film 3 is formed on a portion where an element region is to be formed on underlay oxide film 2.

Referring to FIGS. 30 and 31, underlay oxide film 2 is selectively etched with nitride film 3 used as a mask. Then, the surface of semiconductor substrate 1 is anisotropically etched with nitride film 3 used as mask. Then, an oxide film 11, a nitride film 12, and an oxide film 13 are sequentially formed on semiconductor substrate 1 so as to cover nitride film 3.

Referring to FIGS. 31 and 32, oxide film 13 and nitride film 12 are anisotropically etched.

Referring to FIGS. 31 and 32, oxide film 13 is partially etched away. Then, referring to FIGS. 32 and 33, oxide film 11 is partially etched away. When the surface of semiconductor substrate 1 is oxidized, element isolation oxide film 7 as shown in FIG. 33 is formed. Since nitride film 12 is also formed at side walls of nitride film 3, the length of bird's beak 9 is made extremely smaller as compared to that formed with an ordinary LOCOS method. Referring to FIGS. 34 and 35, nitride film 3, nitride film 12, and underlay oxide film 2 are removed, and element region 106 and field region 105 are formed.

The SWAMI structure has an advantage that the length of bird's beak 9 can be suppressed. However, since nitride film 12 formed at the side walls suppresses an end portion of the element isolation oxide film, stress concentrates at the end portion of element isolation oxide film 7, causing lattice defects and small defects to be formed at a boundary between element isolation oxide film 7 and semiconductor substrate 1. The lattice defects and small defects cause leakage current.

FIG. 36 is a sectional view of a semiconductor device having element region 106 and element isolation region 105 formed with a trench isolation method.

Referring to FIG. 36, a first groove 113 and a second groove 115 are formed in the surface of semiconductor substrate 1. An impurity layer 118 and an impurity layer 120 are formed in the inner wall surface of second groove 115. An oxide film 116 is formed so as to cover the sidewall surface of second groove 115. An oxide film 119 is provided at the bottom surface of second groove 115 so as to join oxide film 116. Polysilicon 117 fills second groove 115. An oxide film 114 is provided at the side wall of first groove 113. An oxide film 112 is provided on the surface of semiconductor substrate 1 so as to surround first groove 113. With such a trench isolation method, semiconductor substrate 1 is divided into element isolation region 105 and element region 106. An element such as an MOSFET is formed on element region 106. The trench isolation method has an advantage that the element isolation width can be made small, since there is no bird's beak. However, lattice defects are formed at a boundary between oxide film 116 covering the inner wall surface of second groove 115 and semiconductor substrate 1, causing leakage current.

Description will now be given of how lattice defects cause leakage current.

When a reverse bias is applied to a pn junction, a depletion layer is formed in the vicinity of the junction. In the depletion layer, high electric field is applied depending on the bias condition. The width W of the depletion layer depends on impurity distribution as shown by the expression (1).

$$W = \frac{2\epsilon_s \epsilon_o}{q} \frac{N_A + N_D}{N_A N_D} (V_{bi} + V_R) \quad (1)$$

In the expression (1), $\epsilon_s$ is a dielectric constant, $\epsilon_o$ is a dielectric constant in vacuum, q is a unit charge, $N_A$ is an acceptor concentration, $N_D$ is a donor concentration, $V_{bi}$ is a built-in potential, and $V_R$ is a reverse bias voltage.

Leakage current caused by lattice defects is generated in the Shockley-Read-Hall process (hereinafter referred to as an "SRH process"). The SRH process is based on four phenomena as shown in FIGS. 37A to 37D.

In FIGS. 37A to 37D, reference character 132 denotes an end of a conduction band, reference character 133 denotes an end of a valence band, reference character 134 denotes an electron in the conduction band, reference character 135 denotes the trap center (trap), and reference character 136 denotes a hole in the valence band. The trap center (trap) refers to an unsaturated bond hand of a silicon atom, or the like, in a silicon substrate or an oxide film.

In FIG. 37A, an electron of the conduction band is captured by the trap. In FIG. 37B, the electron captured by the trap is released, and transitions to the conduction band. In FIG. 37C, a hole in the valence band transitions to be captured by the negatively charged trap, so that the trap becomes neutral. In FIG. 37D, the hole captured by the trap is released, and transitions to the valence band. A net recombination velocity U is given by the expression (2).

$$U = \frac{np - n_i^2}{\tau_{po}(n + n_o) + \tau_{no}(p + p_o)} \quad (2)$$

In the expression (2), n is an electron concentration, p is a hole concentration, $n_i$ is an intrinsic carrier concentration, $\tau_{po}$ is a reciprocal number of a product of a trap density and a velocity at which the trap captures a hole, and $\tau_{no}$ is a reciprocal number of a product of the trap density and a velocity at which the trap captures an electron.

$n_o$ and $p_o$ are given by the expressions (3) and (4), respectively.

$$n_o = n_i \exp[(\epsilon_t - \epsilon_i)/k_B T] \quad (3)$$

$$p_o = n_i \exp[(\epsilon_i - \epsilon_t)/k_B T] \quad (4)$$

In the expressions (3) and (4), $v_t$ and $v_i$ are a trap level and an intrinsic Fermi level, respectively, $k_B$ is a Boltzmann's constant, and T is an absolute temperature.

Current $I_{gen}$ generated in the depletion layer formed by application of a reverse bias to the pn junction is given by the expression (5).

$$I_{gen} = qIUIWA \quad (5)$$

In the expression (5), A is a cross sectional area of the pn junction. At the time of application of a reverse bias, diffusion current is generated in an intermediate charge region at both ends of the depletion layer, that is, in a neutral p-type impurity layer and a neutral n-type impurity layer. Diffusion current $I_{diff,n}$ of an electron in a p region is given by the expression (6).

$$I_{diff,n} = \frac{qD_n n_i^2}{N_A L_n} A \quad (6)$$

Diffusion current $I_{diff,p}$ of a hole in an n region is given by the expression (7).

$$I_{diff,p} = \frac{qD_p n_i^2}{N_D L_p} A \quad (7)$$

In the expressions (6) and (7), Dn, Dp are diffusion coefficients of an electron and a hole, and $L_n$, $L_p$ are diffusion lengths of an electron and a hole. Therefore, current $I_R$ at the time of application of a reverse bias is given by the expression (8).

$$I_R = \left[ q|U|W + q\left(\frac{D_n n_i^2}{N_A L_n} + \frac{D_p n_i^2}{N_D L_p}\right)\right] A \qquad (8)$$

The expression (8) represents leakage current. Since $np \ll n_i^2$ in the depletion layer, U can be approximated as follows.

$$U = -\frac{\sigma_c V_{th} N_t n_i}{2} \qquad (9)$$

In the expression (9), $\sigma_c$ is a trap sectional area, $V_{th}$ is a velocity of carriers, and $N_t$ is a density of the trap center. It is found from the expressions (8) and (9) that the greater the density of the trap center and the width of the depletion layer, the greater the leakage current. If a higher electric field is applied to the depletion layer, carriers generated in the depletion layer are accelerated to the electric field, causing impact ionization, and generating new electrons in the conduction band. As a result, leakage current increases. As a method of controlling leakage current caused by the SRH process, it is considered to decrease the trap density in the vicinity of the pn junction, or to increase the concentration of the pn junction to suppress the extension of the depletion layer.

Other than the above, degradation of an LOCOS oxide film formed for element isolation is considered to cause leakage current. More specifically, with miniaturization of the ULSI, the element isolation width becomes smaller, and strong electric field is more likely to be applied to the LOCOS oxide film. Therefore, hydrogen atoms attracted by the electric field drift from a film deposited on the LOCOS oxide film to a boundary surface between the LOCOS oxide film and the substrate, and form trap to reduce the threshold voltage of a parasitic transistor. As a result, leakage current is generated. Therefore, in forming an LOCOS oxide film or a trench oxide film, it is inevitable for enhancement of reliability of the element isolation oxide film to decrease as much as possible the number of hydrogen atoms in the oxide film, and to decrease as much as possible the number of unsaturated bond hands of silicon atoms in the oxide film causing trap.

As described above, in any method where elements are isolated in the LOCOS structure, the SWAMI structure, or the trench structure, lattice defects generated by thermal stress between silicon oxide films caused leakage current, preventing perfect electrical isolation.

Also in the conventional LOCOS structure, a problem was leakage current caused by lattice defects at a small density which exist in the vicinity of the pn junction between the drain impurity layer and the channel cut impurity layer directly under the LOCOS oxide film.

Since the element isolation width of the LOCOS oxide film for element isolation becomes smaller with miniaturization of the ULSI, the electric field applied to the LOCOS oxide film becomes larger. As a result, trap is more likely to be generated by drifting of hydrogen atoms from a film deposited on the LOCOS oxide film to a boundary surface between the LOCOS oxide film and the silicon substrate. The trap decreases the threshold voltage of a parasitic MOSFET, and generates leakage current.

SUMMARY OF THE INVENTION

One object of the present invention is to provide a semiconductor device including an element isolation structure with little leakage current.

Another object of the present invention is to provide a semiconductor device including an LOCOS isolation structure with little leakage current.

Still another object of the present invention is to provide a semiconductor device including a trench isolation structure with little leakage current.

A further object of the present invention is to provide a method of manufacturing a semiconductor device including an element isolation structure with little leakage current.

The semiconductor device according to one aspect of the present invention includes a semiconductor substrate. An element isolation oxide film is provided in the main surface of the semiconductor substrate. A boundary layer including nitrogen atoms is provided at a boundary between the element isolation oxide film and the semiconductor substrate.

The semiconductor device according to another aspect of the present invention includes a semiconductor substrate. A trench for isolating an element region from the other element regions is formed in the surface of the semiconductor substrate. An impurity layer is provided in the inner wall surface of the trench. An oxide film is provided so as to cover the inner wall surface of the trench. A boundary layer including nitrogen atoms is provided at a boundary between the oxide film and the inner wall surface of the trench.

In the method of manufacturing a semiconductor device according to still another aspect of the present invention, an underlay oxide film and a nitride film are sequentially formed on the surface of a semiconductor substrate. The underlay oxide film and the nitride film are patterned so that an opening can be formed on a portion where an element isolation oxide film is to be formed. With the nitride film used as a mask, the surface of the semiconductor substrate is oxidized, thereby forming an element isolation oxide film isolating an element region from the other element regions in the surface of the semiconductor substrate. After removing the underlay oxide film and the nitride film, the semiconductor substrate is heat-treated at a temperature of 950° C. or more. An element is formed in the element region.

In the semiconductor device according to the one aspect of the present invention, the boundary layer provided at the boundary between the element isolation oxide film and the semiconductor substrate includes nitrogen atoms. Such a structure can be obtained by heat-treating the substrate in an atmosphere of $N_2O$, $NF_3$, or the like after formation of the element isolation oxide film. Because of the heat treatment, the number of interstitial silicon atoms in an $SiO_x$ layer formed at the boundary between the element isolation oxide film and the semiconductor substrate is decreased. Further, unsaturated bond hands of silicon are terminated with nitrogen atoms. Therefore, a semiconductor device with little leakage current can be obtained.

In the semiconductor device according to the another aspect of the present invention, the boundary surface provided at the boundary between the oxide film and the inner wall surface of the trench includes nitrogen atoms. Such a structure can be obtained by heat-treating the substrate in an atmosphere of $N_2O$, $NF_3$, or the like after formation of the oxide film at the inner wall surface of the trench. By this heat treatment, the number of interstitial silicon atoms in an $SiO_x$ layer formed at the boundary between the oxide film and the inner wall surface of the trench decreases, and unsaturated bond hands of silicon are terminated with nitrogen atoms. Therefore, a semiconductor device with little leakage current can be obtained.

In the method of manufacturing a semiconductor device according to the still another aspect of the present invention, the semiconductor substrate is heat-treated at a temperature of 950° C. or more after formation of the element isolation oxide film. By this heat treatment, the number of interstitial silicon atoms in an $SiO_x$ layer formed at the boundary between the element isolation oxide film and the semiconductor substrate decreases. Therefore, a semiconductor device with little leakage current can be obtained.

When the above heat treatment is carried out in an $N_2O$ atmosphere, an unsaturated bond hand of a silicon atom in the $SiO_x$ layer (Si—Si bond) is broken, and the broken portion is oxidized to form an $SiO_2$ or SiON compound, thereby terminating the Si—Si bond. As a result, a semiconductor device having a decreased trap density can be obtained.

The present invention also has the effect as follows. More specifically, an unsaturated bond hand is terminated with a nitrogen atom. Even if hydrogen atoms move to the Si—N bond from a film deposited from the LOCOS oxide film by drifting, hydrogen atoms cannot break the Si—N bond because of the large Si—N bond energy. As a result, an oxide film in which trap is less likely to occur is obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the drawings.

Embodiment 1

FIGS. 1 to 7 are sectional views schematically showing a method of manufacturing a semiconductor device according to the present invention.

An underlay oxide film 2 and a nitride film 3 are sequentially formed on a semiconductor substrate 1.

Figure 1:
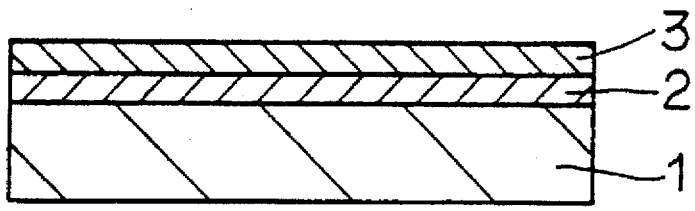
FIGS. 1 to 7 are sectional views showing the first to the seventh steps of a method of manufacturing a semiconductor device according to Embodiment 1.
Figure 2:
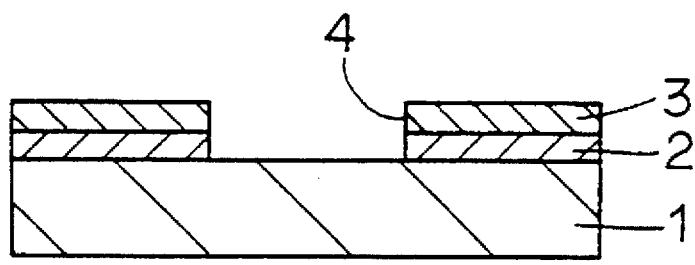

Referring to FIG. 2, underlay oxide film 2 and nitride film 3 are patterned so that an opening 4 is formed on a portion where an element isolation oxide film is to be formed.

Figure 3:
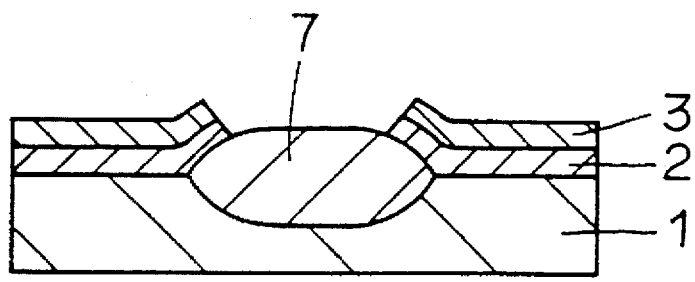

Referring to FIG. 3, by oxidizing the surface of semiconductor substrate 1 with nitride film 3 used as a mask, an element isolation oxide film 7 is formed in the surface of semiconductor substrate 1.

Figure 4:
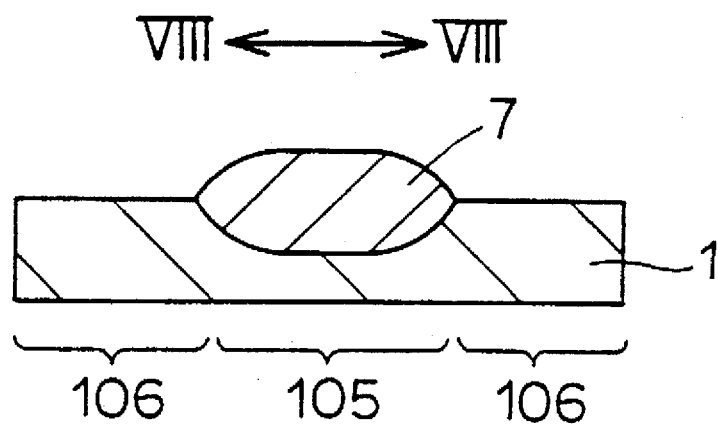

Referring to FIGS. 3 and 4, underlay oxide film 2 and nitride film 3 are removed. As a result, an element region 106 and an element isolation region 105 are formed.

Figure 5:
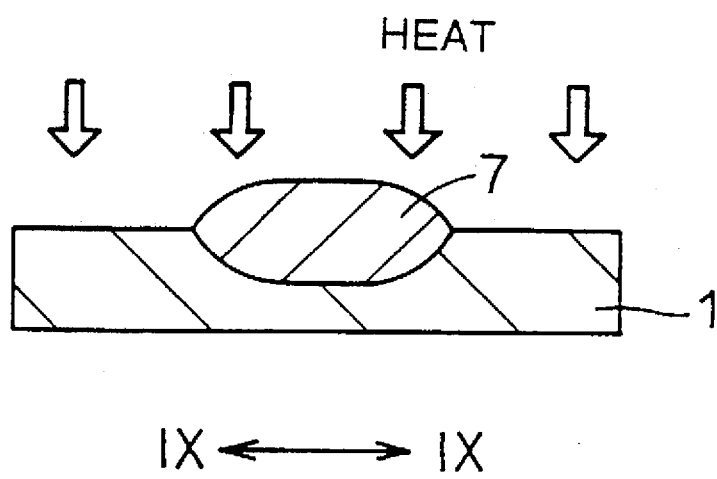

Referring to FIG. 5, semiconductor substrate 1 is heat-treated at a temperature of 950° C. or more in a nitrogen or $N_2O$ atmosphere. The effect of this heat treatment will be described later.

Figure 6:
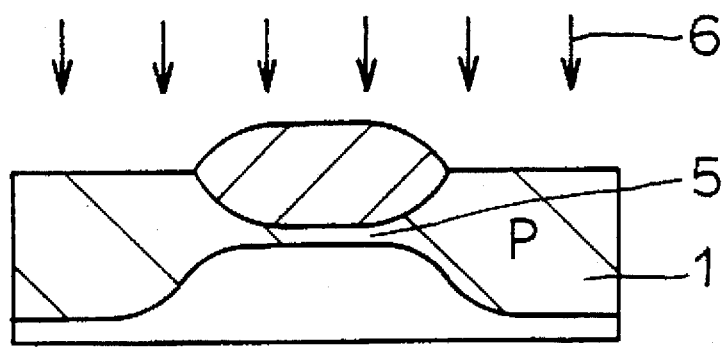

Referring to FIG. 6, impurity ions 6 for forming a channel cut layer 5 are implanted into the surface of semiconductor substrate 1.

Figure 7:
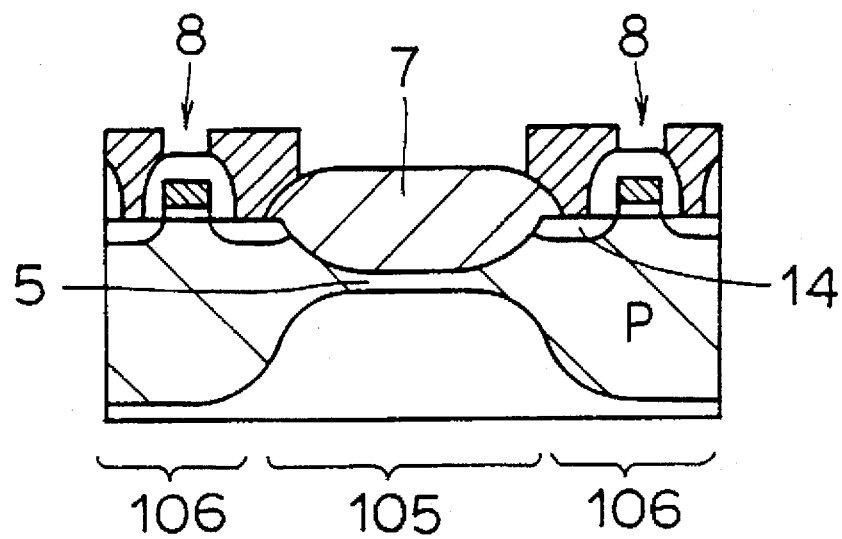

Referring to FIG. 7, an MOSFET 8 is formed in element region 106.

The effect of heat treatment shown in FIG. 5 will now be described.

Figure 8:
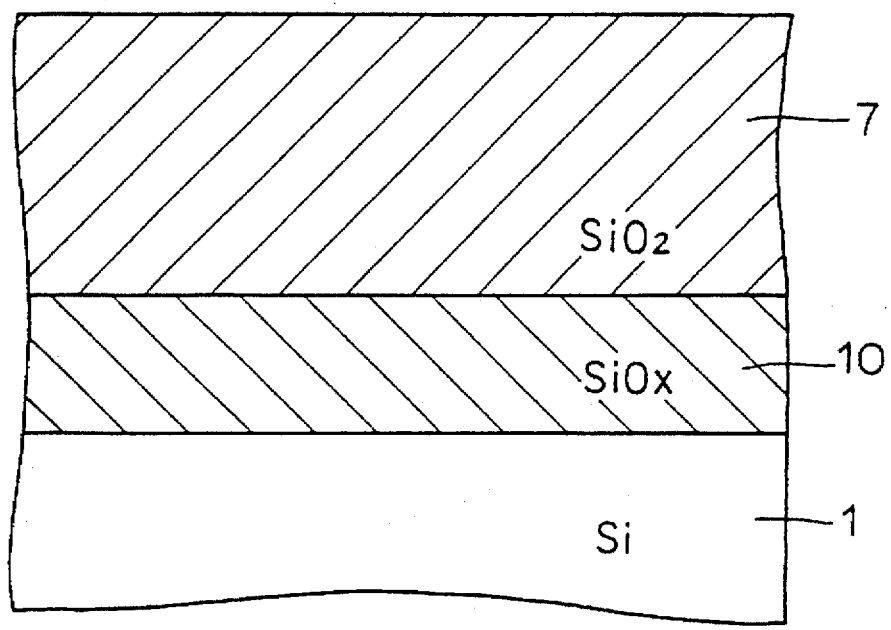
FIGS. 8 to 10 are enlarged sectional views showing the first to the third steps of a main portion of the method of manufacturing a semiconductor device according to Embodiment 1.

FIG. 8 is an enlarged view of a portion between VIII—VIII in FIG. 4, showing how a boundary surface is between element isolation oxide film 7 and silicon substrate 1 in detail. Element isolation oxide film 7 is an oxide film having a mesh structure of $SiO_2$, not including interstitial silicon. Between element isolation oxide film 7 and semiconductor substrate 1, there exists is an $SiO_x$ layer 10 (0<X<2) including excessive interstitial silicon which is left unreacted at the time of oxidation reaction. If excessive interstitial silicon exists in $SiO_x$ layer 10 at a high density, stress concentrates in the surface of semiconductor substrate 1, causing lattice defects. In addition, there are a number of unsaturated bond hands of silicon atoms (Si—Si bond) in $SiO_x$ layer 10, causing trap.

Figure 9:
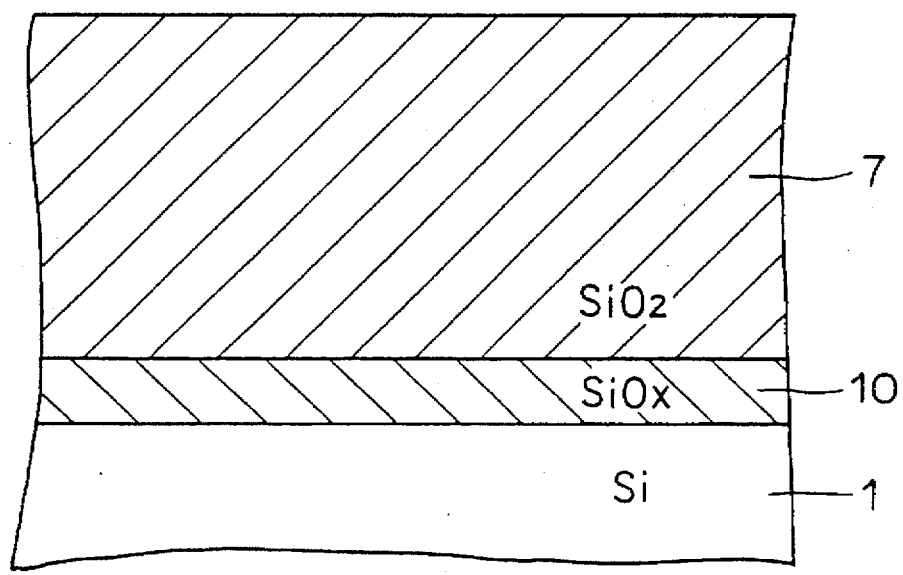

FIG. 9 is a sectional view of a semiconductor device after being subjected to heat treatment shown in FIG. 5. FIG. 9 is an enlarged view of a portion between IX—IX in FIG. 5.

Referring to FIGS. 8 and 9, the thickness of $SiO_x$ layer 10 is decreased after heat treatment. More specifically, excessive interstitial silicon in $SiO_x$ layer 10 gives the following reaction by heat treatment in a nitrogen atmosphere at a temperature of 950° C. or more.

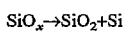

$$SiO_x \rightarrow SiO_2 + Si$$

More specifically, when $SiO_x$ layer 10 is heat-treated in a nitrogen atmosphere at 950° C. or more, $SiO_x$ is decomposed into $SiO_2$ and Si. $SiO_2$ generated at this time moves toward element isolation oxide film 7, and Si generated moves toward silicon substrate 1. More specifically, by heat treatment in the nitrogen atmosphere at 950° C. or more, the thickness of $SiO_x$ layer 10 decreases, and the thickness of $SiO_2$, that is, the thickness of element isolation oxide film 7 increases. Heat treatment at a temperature of 950° C. or more is required because bond energy between silicon atoms is relatively high, that is, approximately 2 eV. Since density of interstitial silicon in $SiO_x$ layer 10 becomes low due to this heat treatment at a temperature of 950° C. or more, stress in the $Si/SiO_2$ boundary surface is relaxed, which in turn suppresses formation of lattice defects in semiconductor substrate 1.

The concept explained with reference to FIGS. 8 and 9 is also applied to a trench element isolation structure to be described later.

Figure 10:
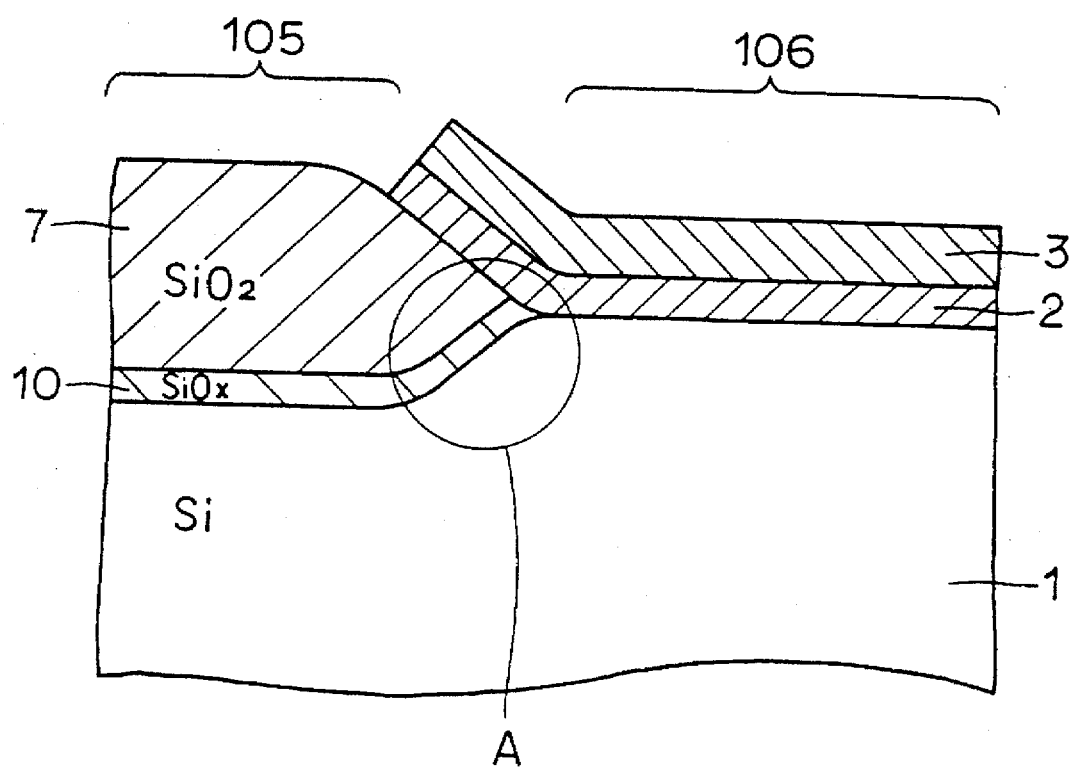

Referring to FIG. 10, when element isolation oxide film 7 is an LOCOS film, stress concentrates an end portion (indicated by A) of a field oxide film, in particular. However, by carrying out heat treatment in a nitrogen atmosphere at a temperature of 1100° C. for 120 minutes, for example, following formation of an LOCOS oxide film and removal of a mask layer such as a nitride film, the stress is effectively relaxed at the end portion (indicated by A) of element isolation oxide film 7, in particular.

Returning to FIG. 7, when an n type MOSFET is formed in element region 106, drain impurity layer 14 and channel cut layer 5 form a pn junction in the vicinity of the end portion of element isolation oxide film 7. Therefore, relaxation of stress in this portion is effective in reduction of lattice defect density, and in reduction of leakage current.

Referring to FIGS. 4 to 6, in this embodiment, following removal of a mask layer such as a nitride film, heat treatment in the nitrogen atmosphere is carried out, and then channel cut layer 5 is formed. Since heat treatment shown in FIG. 5 is carried out before formation of channel cut layer 5, the narrow channel effect is prevented. If heat treatment at a temperature of 950° C. is carried out after formation of channel cut layer 5, boron is diffused from the channel cut layer into element region 106, resulting in the narrow channel effect. In this embodiment, in order to prevent the narrow channel effect, heat treatment is carried out in the nitrogen atmosphere following formation of the LOCOS oxide film.

In this embodiment, it is preferable to carry out another heat treatment at a temperature of 800° C. or less after heat treatment at a temperature of 950° C. in the step shown in FIG. 5. By this another heat treatment, stress is further relaxed.

Embodiment 2

Figure 11:
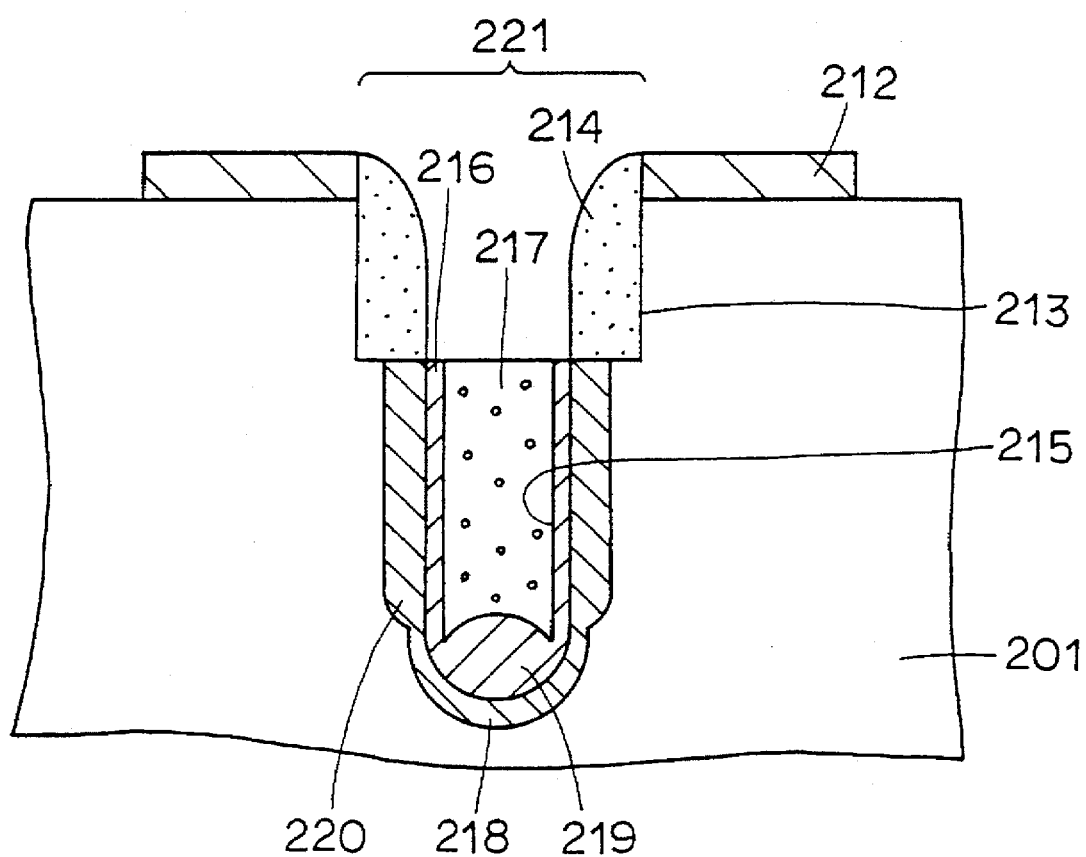
FIG. 11 is a sectional view of a semiconductor device according to Embodiment 2.

This embodiment relates to application of the present invention to a semiconductor device having a trench element isolation structure. Referring to FIG. 11, the semiconductor device includes a semiconductor substrate 201. A first groove 213 is formed in the surface of semiconductor substrate 201. A second groove 215 is formed in semiconductor substrate 201. An impurity layer 220 is provided in the inner wall surface of first groove 215, and an impurity layer 218 is provided in the bottom surface of second groove 215. An oxide film 216 is provided so as to cover the sidewall surface of second groove 215. An oxide film 219 is provided so as to cover the bottom surface of second groove 215. Polysilicon 217 fills second groove 215. An oxide film 214 is provided at the side wall of first groove 213. An oxide film 212 is provided on the surface of semiconductor substrate 211 so as to surround first groove 213.

Oxide film 216 formed on the wall surface of second groove 215 is a thin film of approximately 10 nm. By carrying out heat treatment in a nitrogen atmosphere at a temperature of 1020° C. for 96 minutes following formation of oxide film 216 at the sidewall surface of second groove 215, stress relaxation between oxide films 216, 219 and semiconductor substrate 201 can be implemented, thereby reducing leakage current.

As will be described later, if the above heat treatment is carried out in an $N_2O$ atmosphere, a boundary layer (not shown) including nitrogen atoms is formed at a boundary between the inner wall surface of second groove 215 and semiconductor substrate 201.

As described above, stress relaxation can be implemented by applying the present invention to a semiconductor device having a trench isolation structure, making it possible to reduce leakage current.

Embodiment 3

Figure 12A:
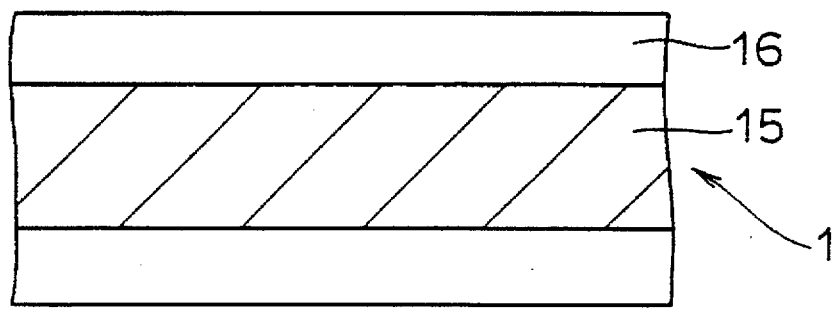
FIG. 12A and 12B are sectional views showing a method of manufacturing a semiconductor device according to Embodiment 3.

This embodiment is characterized in that the surface of a semiconductor substrate is pre-treated before formation of an element isolation oxide film in the main surface of the semiconductor substrate. Referring to FIG. 12A, the semiconductor substrate is first heat-treated in a nitrogen atmosphere at a temperature of 950° C. or more. By this heat treatment at a temperature of 950° C., oxygen atoms existing at a high concentration in the surface of semiconductor substrate 1 evaporate, and precipitate within semiconductor substrate 1, resulting in generation of small defects at a low density. Then, by carrying out another heat treatment at a temperature of 800° C. or less, oxygen atoms in semiconductor substrate 1 further precipitate. Further small defects are formed, and a gettering layer 15 is formed. Gettering layer 15 serves to catch small defects newly generated in a surface layer 16 in the later steps. In order to increase a density of small defects in gettering layer 15, heat treatment in the nitrogen atmosphere at 800° C. or less and heat treatment at a temperature of 950° C. or more must be carried out continuously.

Figure 12B:
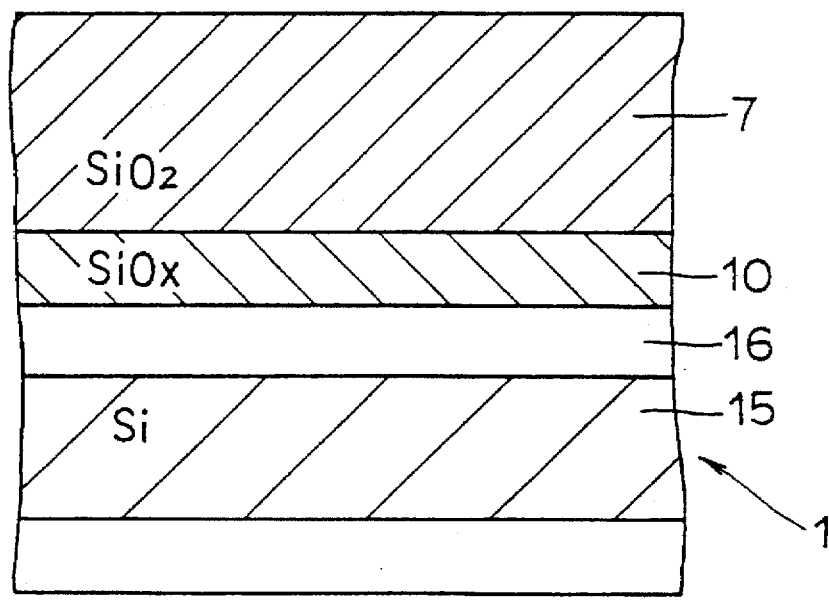

Then, referring to FIG. 12B, an underlay oxide film and a nitride film are sequentially formed on the surface of semiconductor substrate 1 (not shown). The underlay oxide film and the nitride film are patterned so that an opening can be formed on a portion where an isolation oxide film is to be formed (not shown). The surface of semiconductor substrate 1 is oxidized with the nitride film used as a mask, thereby forming element isolation oxide film 7 in the surface of semiconductor substrate 1. At this time, $SiO_x$ layer 10 is also formed. Lattice defects formed in surface layer 16 are caught by gettering layer 15. As a result, leakage current can be reduced. After removing the underlay oxide film and the nitride film, stress in $SiO_x$ layer 10 is relaxed by heat-treating semiconductor substrate 1 at a temperature of 950° C. or more, improving reliability.

Embodiment 4

In Embodiment 1, heat treatment at a high temperature was carried out in a nitrogen atmosphere after formation of an LOCOS oxide film. By this heat treatment at a high temperature, unsaturated bond hands of silicon atoms in an $SiO_x$ layer bond to unsaturated bond hands of other silicon atoms, resulting in formation of an $SiO_2$ layer having a mesh structure. However, a number of unsaturated bond hands of silicon atoms, which may cause trap, still remain after heat treatment in the nitrogen atmosphere. This is because nitrogen molecules ($N_2$) used in the nitrogen atmosphere have large bond energy, and they are not decomposed at a temperature of approximately 1100° C.

Figure 13A:
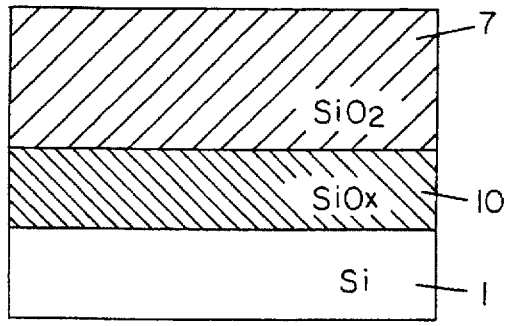
FIG. 13(A) and 13(B) are diagrams showing a feature of a method of manufacturing a semiconductor device according to Embodiment 4 using a chemical reaction formula with respect to FIGS. 8 and 9, respectively.
Figure 13A:
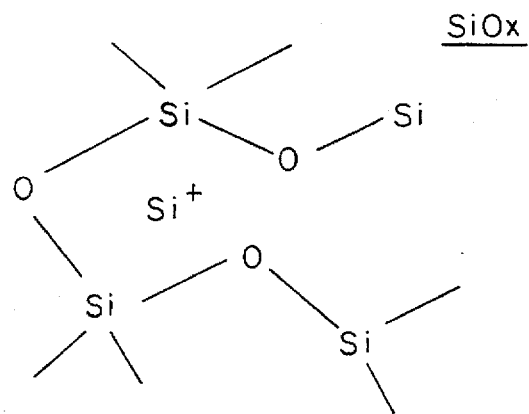
Figure 13B:
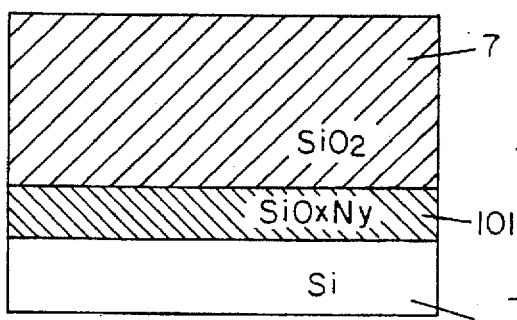
Figure 13B:
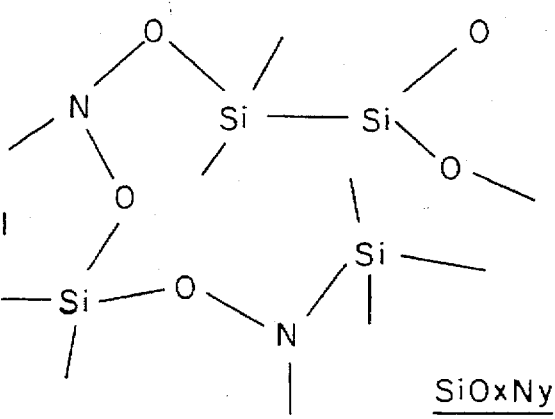

FIG. 13(A) corresponds to FIG. 8 of embodiment 1 and FIG. 13(B) corresponds to FIG. 9 of embodiment 1. Referring to FIGS. 13(A) and (B), by heat treatment at a temperature of 950° C. or more, unsaturated bond hands of silicon atoms in an $SiO_x$ layer 10 are linked to unsaturated bond hands of other silicon atoms. In addition, $N_2O$ is decomposed at a high temperature into nitrogen atoms. The nitrogen atoms terminate unsaturated bond hands of silicon atoms and give $SiO_xN_y$ layer 101 as shown in FIG. 13(B). As a result, as compared to the case of heat treatment in the nitrogen atmosphere, the trap density is sufficiently decreased (the concentration of nitrogen atoms is $10^{18}$~$10^{21}$ atms/cm$^3$). Therefore, the threshold voltage of a parasitic MOS transistor in a field region is less likely to decrease, resulting in reduction of leakage current.

In this embodiment, it is preferred to carry out further heat treatment at a temperature of 800° C. or less after the above heat treatment at a temperature of 950° C. The heat treatment at a temperature of 800° C. or less is effective in terminating unsaturated bond hands of silicon atoms with nitrogen atoms.

Embodiment 5

In this embodiment, formation of an LOCOS oxide film in Embodiment 1 is carried out by selectively oxidizing a substrate in a mixed gas of $O_2$ and $NF_3$ at a temperature of 950° C. By forming an LOCOS oxide film in such a way, the number of unsaturated bond hands of silicon atoms at a boundary surface between the silicon substrate and the LOCOS oxide film can be decreased at a time of formation of the LOCOS oxide film. More specifically, during oxidation, $NF_3$ is decomposed into nitrogen atoms and fluorine atoms, which terminate unsaturated bond hands of silicon atoms. In addition, the trap density is sufficiently decreased.

If the concentration of $NF_3$ in the mixed gas is too high, a fluorine atom breaks an Si—O—Si bond to create a new Si—Si bond 100, generating a new unsaturated bond hand. As a result, the trap density increases on the contrary. Therefore, it is preferable that the amount of $NF_3$ in the mixed gas is approximately 300 ppm or less.

After formation of the LOCOS oxide film, unsaturated bond hands of Si—F—Si are terminated with nitrogen atoms or oxygen atoms by carrying out heat treatment in the $N_2O$ atmosphere at a temperature of 950° C. As a result, the trap density in the oxide film can be decreased, and the trap density in the semiconductor substrate can be further decreased.

This embodiment can be similarly applied to the case of a trench isolation structure. More specifically, referring to FIG. 11 again, oxide film 216 and oxide film 219 are formed at the inner wall of second groove 215. Oxide films 216 and 219 are formed by oxidizing the inner wall of second groove 215 by approximately 15 nm with a mixed gas of $O_2$ and $NF_3$ at a temperature of 950° C. It is preferable that the concentration of $NF_3$ in the mixed gas is 300 ppm or less. Following formation of oxide films 216 and 219, heat treatment at a temperature of 950° C. in the $N_2O$ atmosphere is carried out. By this heat treatment, the film thickness of the $SiO_x$ layer is decreased, although not shown. As a result, the trap density in oxide films 216 and 219 can be decreased, and the trap density in semiconductor substrate 201 can be further decreased.

Embodiment 6

Figure 14:
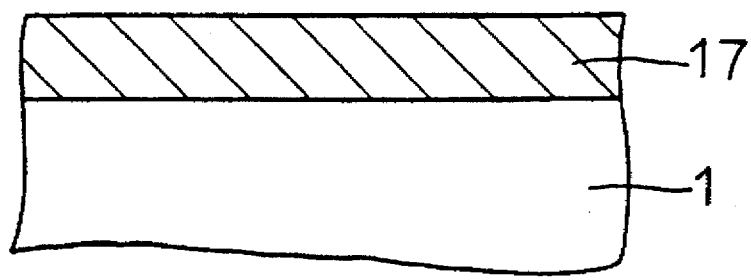
FIGS. 14 to 17 are sectional views showing the first to the fourth steps of a method of manufacturing a semiconductor device according to Embodiment 6.
Figure 15:
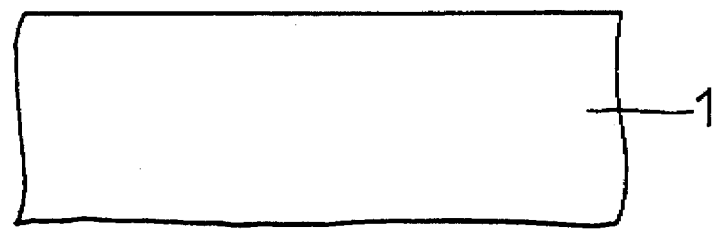
Figure 16:
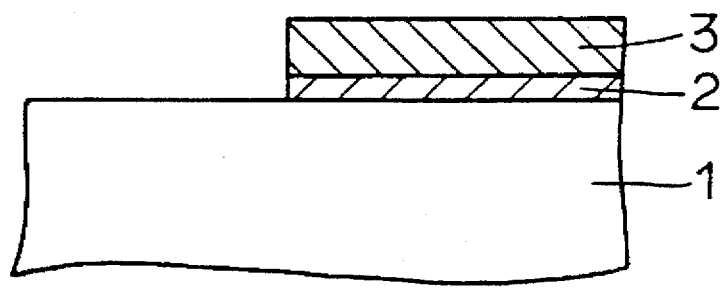
Figure 17:
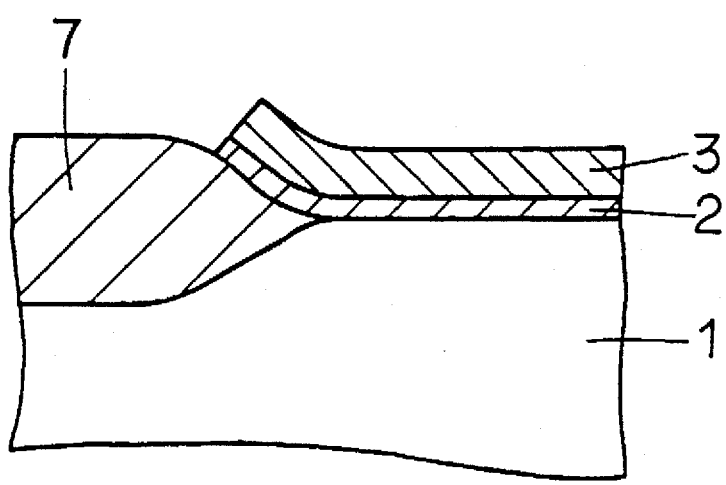

FIGS. 14 to 17 are sectional views showing the steps of Embodiment 6. Referring to FIG. 14, the surface of semiconductor substrate 1 is thermally oxidized at a temperature of 1000° C. or more to form an oxide film 17. Obtained oxide film 17 is called a sacrifice-oxide film. Referring to FIGS. 14 and 15, oxide film 17 is removed from the surface of semiconductor substrate 1. Such a step is called sacrifice oxidation. By this sacrifice oxidation, oxygen atoms in the surface portion are removed out of oxygen atoms included in semiconductor substrate 1 at a high concentration. Therefore, oxygen atoms do not precipitate in the vicinity of the surface, causing no small defects. Then, referring to FIG. 16, underlay oxide film 2 and nitride film 3 are selectively formed on semiconductor substrate 1. Referring to FIG. 17, by oxidizing the surface of semiconductor substrate 1 with nitride film 3 used as a mask, element isolation oxide film 7 is formed. Since there are few small defects in the vicinity of the surface of the semiconductor substrate, leakage current in the vicinity of the pn junction at the end of the LOCOS film decreases.

Embodiment 7

A method according to Embodiment 7 will be described with reference to FIGS. 18 to 20.

Figure 18:
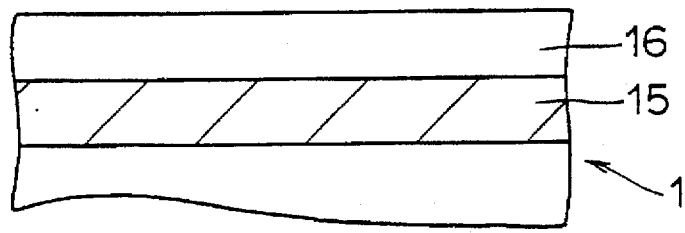
FIGS. 18 to 20 are sectional views showing the first to the third steps of a method of manufacturing a semiconductor device according to Embodiment 7.

Referring to FIG. 18, semiconductor substrate 1 is heat-treated in a nitrogen atmosphere at a temperature of 1000° C. or more. By this heat treatment, oxygen atoms included in the surface layer of semiconductor substrate 1 evaporate from the surface of substrate 1. By this treatment, oxygen atoms precipitate in the wafer, resulting in formation of gettering layer 15, as shown in FIG. 18. When another heat treatment is continuously carried out in the nitrogen atmosphere at a temperature of 800° C. or less, the concentration of small defects in gettering layer 15 becomes high, resulting in semiconductor substrate 1 having few small defects in surface layer 16.

Figure 19:
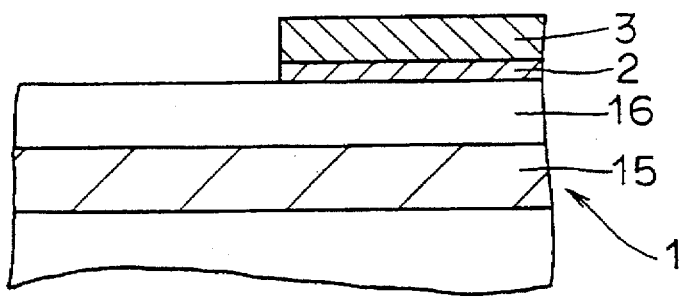
Figure 20:
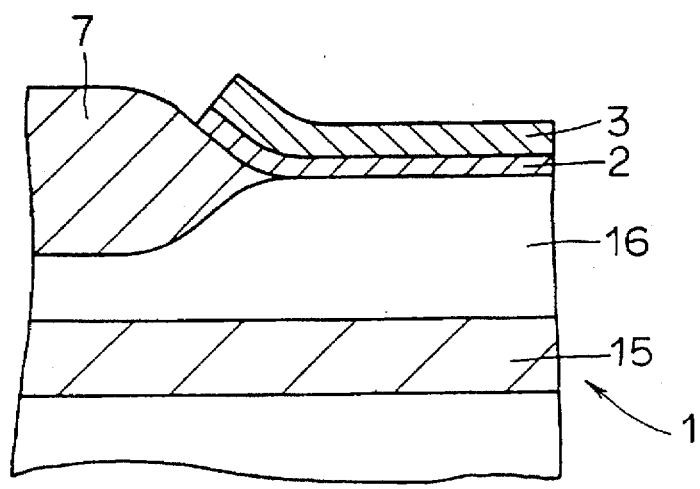
Figure 21:
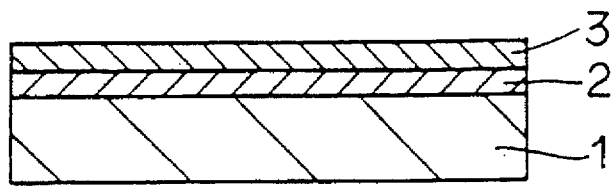
FIGS. 21 to 26 are sectional views showing the first to the sixth steps of a method of manufacturing a conventional semiconductor device.
Figure 22:
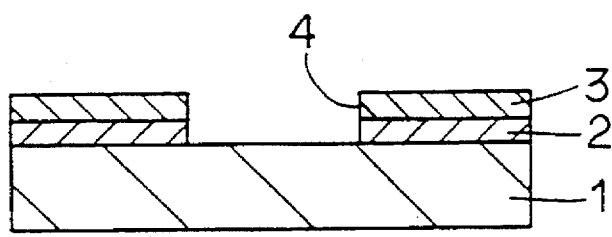
Figure 23:
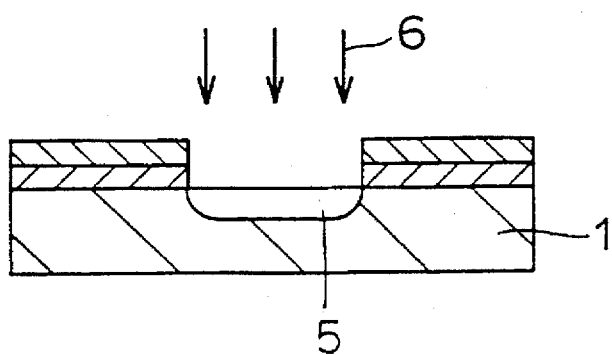
Figure 24:
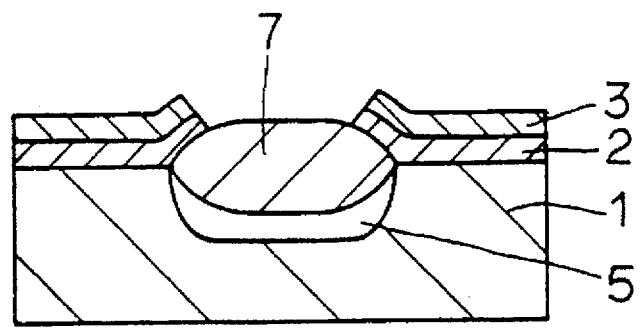
Figure 25:
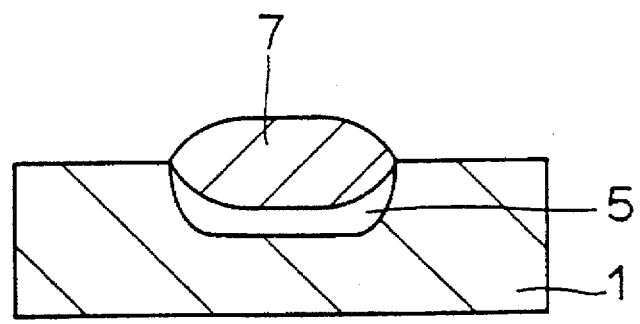
Figure 26:
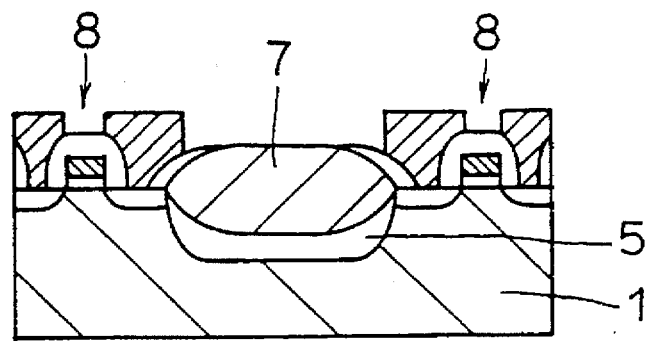
Figure 27:
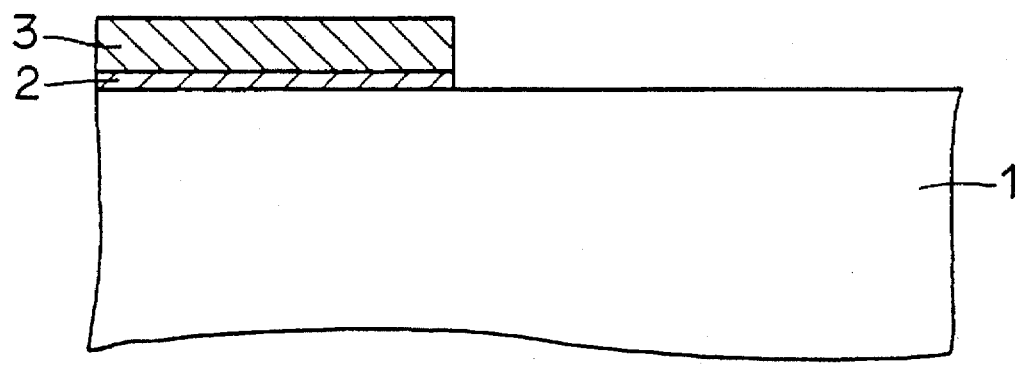
FIGS. 27 and 28 are enlarged sectional views showing the first and the second steps of a main portion of the method of manufacturing a conventional semiconductor device.
Figure 28:
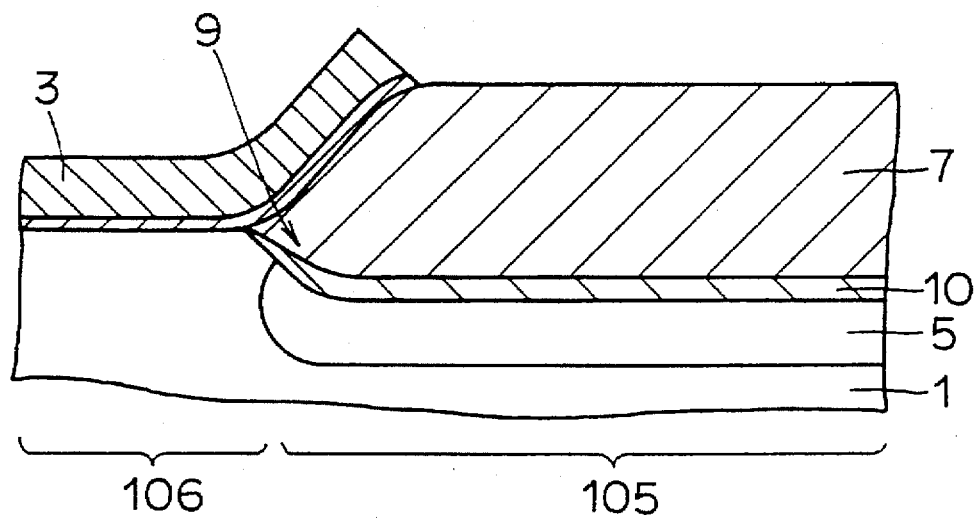
Figure 29:
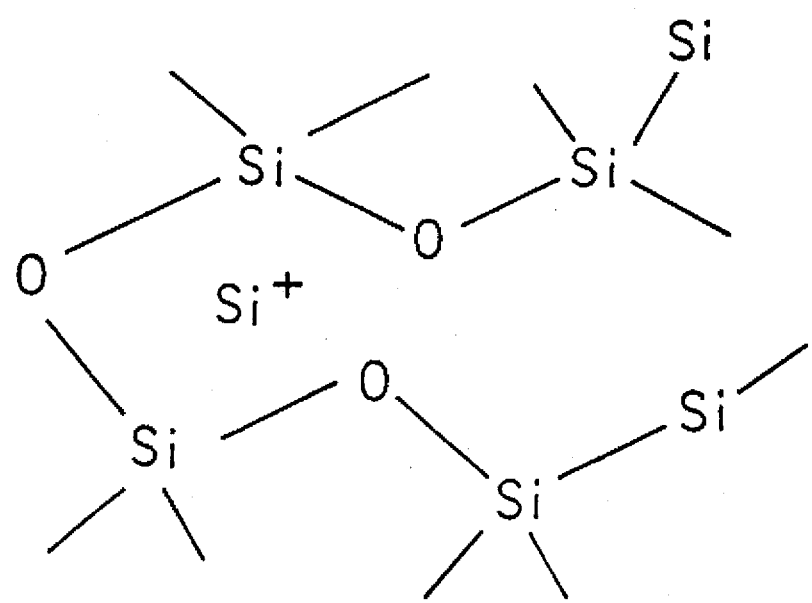
FIG. 29 is a diagram showing a chemical structure of a conventional $SiO_x$ layer.
Figure 30:
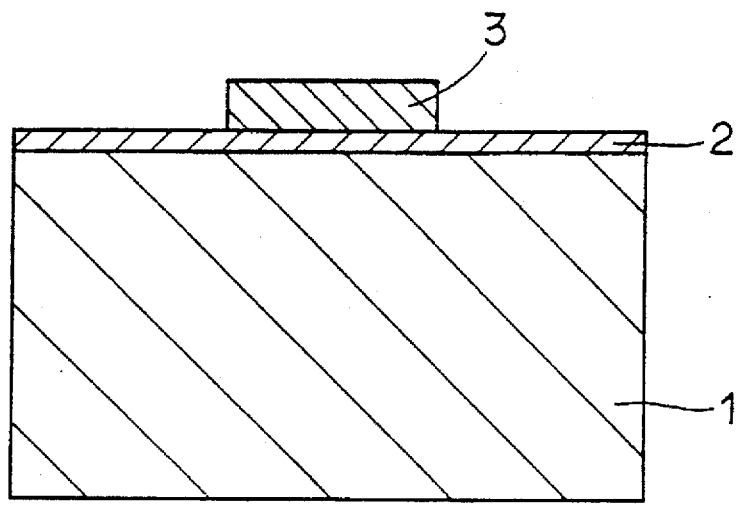
FIGS. 30 to 35 are sectional views showing the first to the sixth steps of a method of manufacturing a semiconductor device using a conventional SWAMI method.
Figure 31:
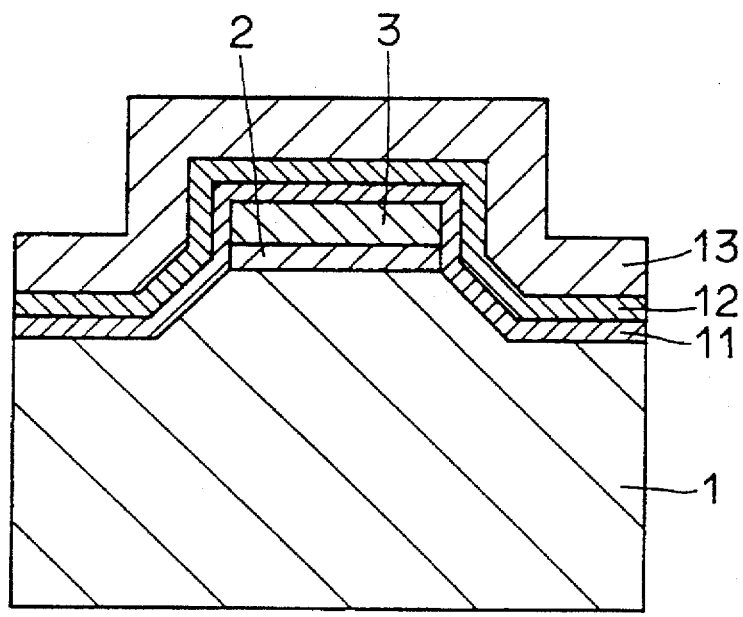
Figure 32:
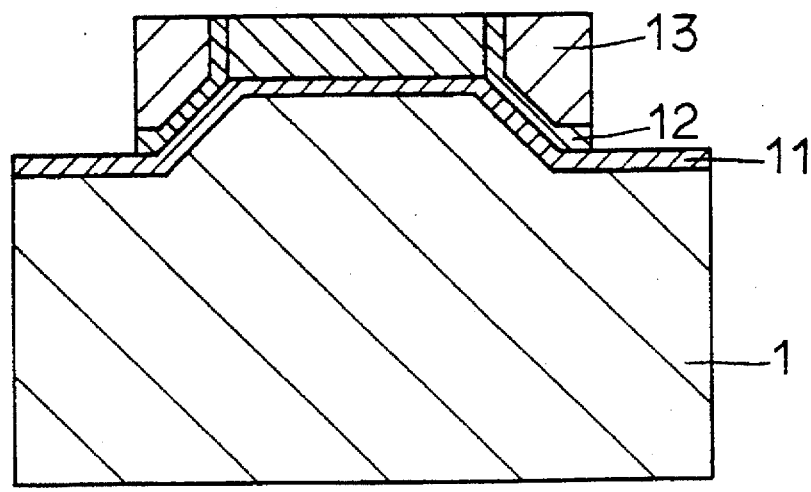
Figure 33:
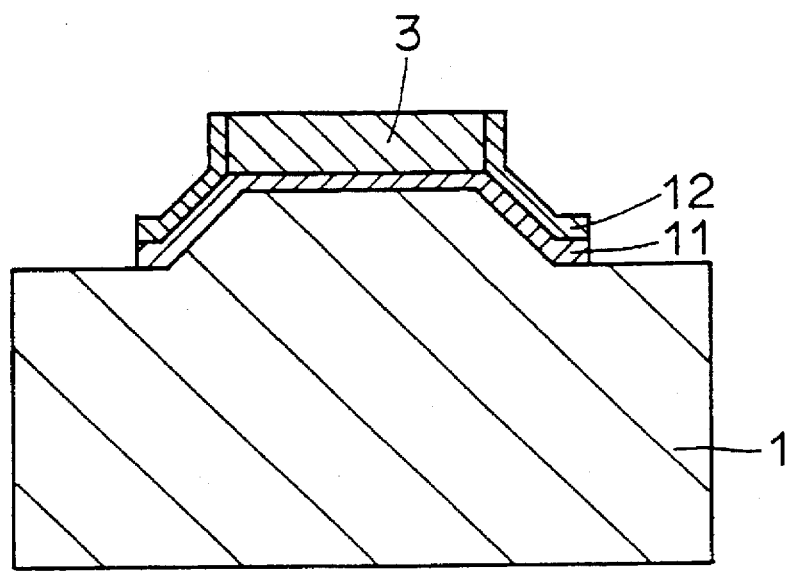
Figure 34:
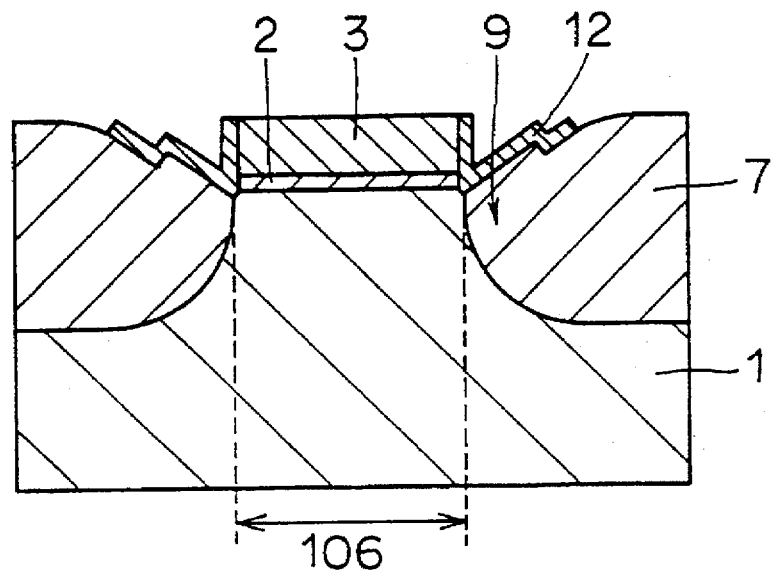
Figure 35:
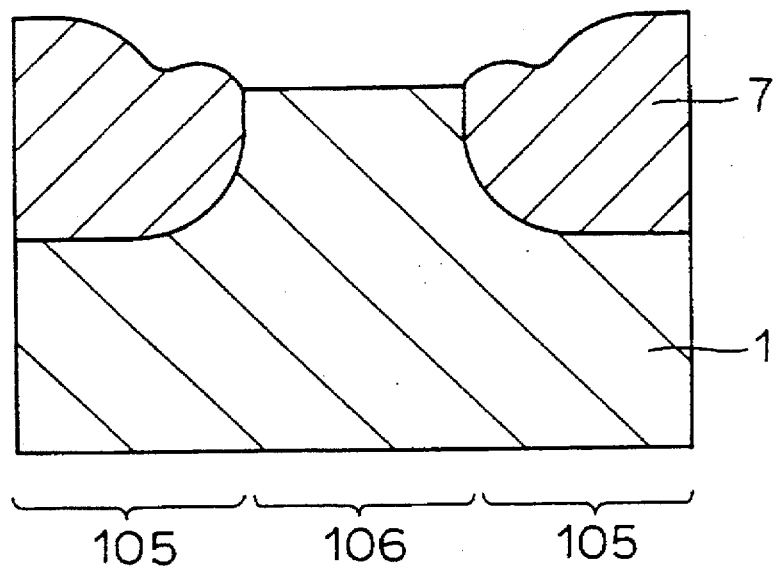
Figure 36:
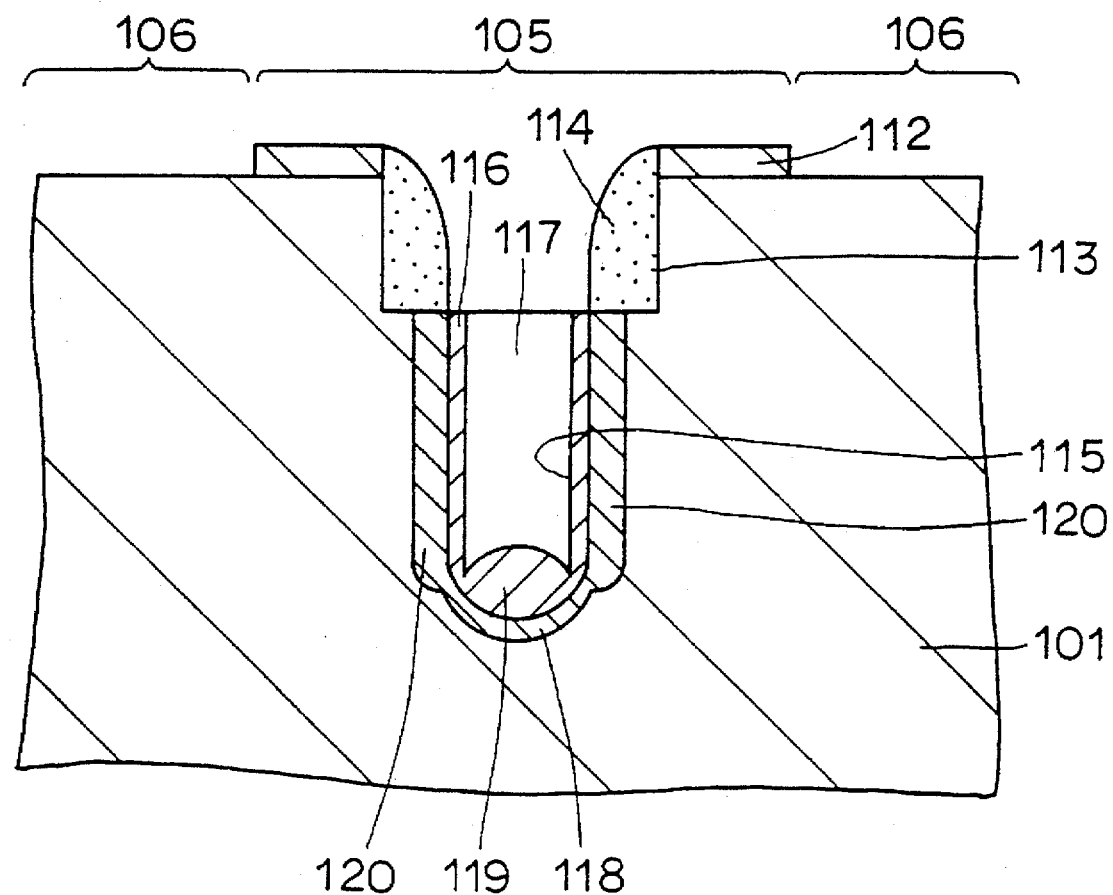
FIG. 36 is a sectional view showing a semiconductor device having a conventional trench isolation structure.
Figure 37A:
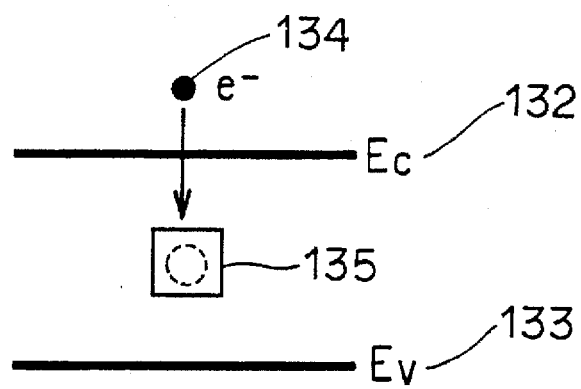
FIGS. 37A to 37D are diagrams for explaining a Shockley-Read-Hall process.
Figure 37B:
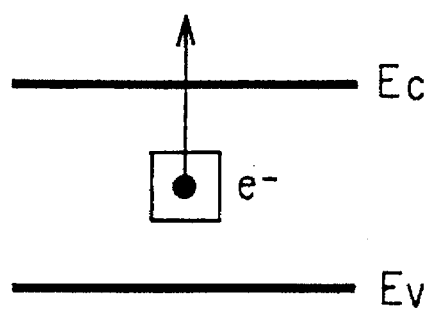
Figure 37C:
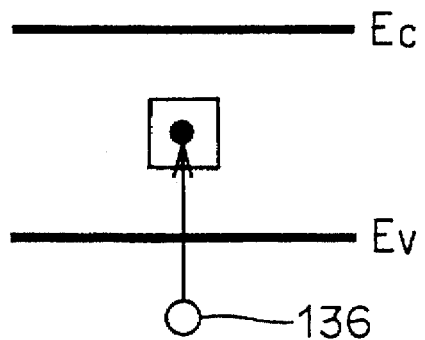
Figure 37D:
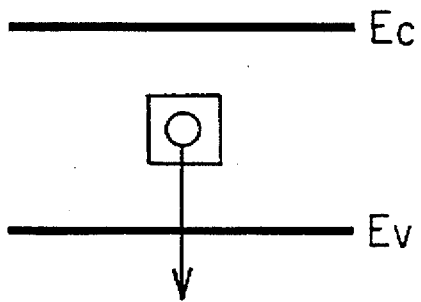
Figure 38:
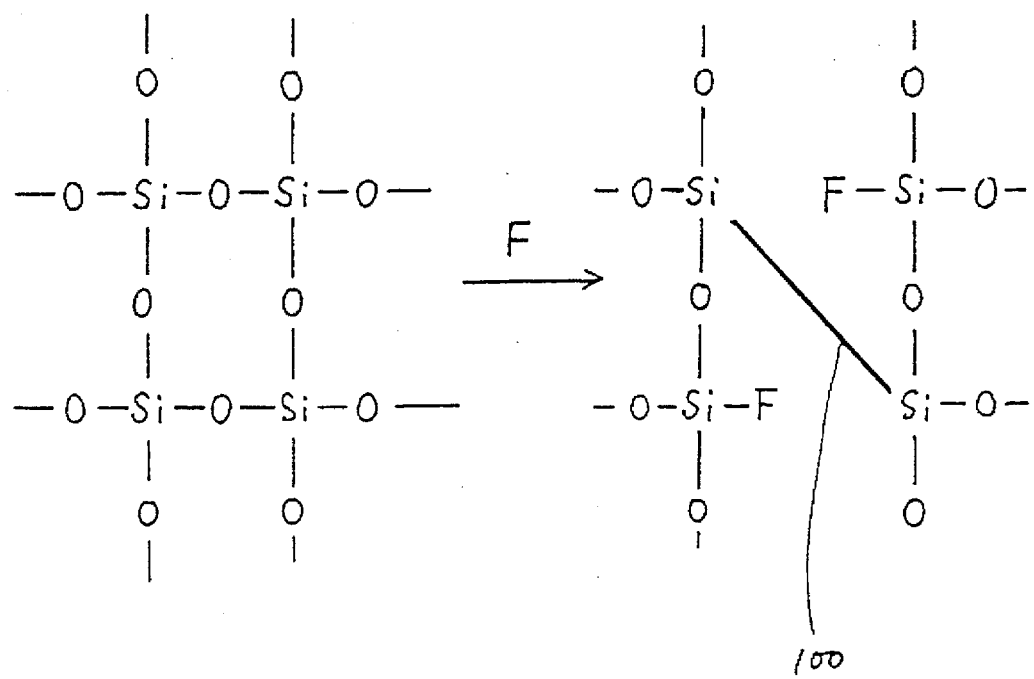
FIG. 38 is a diagram showing a problem in the case where $NF_3$ concentration in a mixed gas is too high.

Referring to FIG. 19, underlay oxide film 2 and nitride film 3 are selectively formed on semiconductor substrate 1. Referring to FIG. 20, with nitride film 3 used as a mask, the surface of semiconductor substrate 1 is thermally oxidized to form element isolation oxide film 7. If there are small defects in surface layer 16, stacking faults are formed in the step of oxidizing the semiconductor substrate for formation of an element isolation oxide film. However, if gettering layer 15 is provided as in this embodiment, almost all small defects in the vicinity of the surface are caught in gettering layer 15. As a result, lattice defects causing leakage current are not formed in the vicinity of the surface. According to this embodiment, since the number of lattice defects in the vicinity of the end portion of the LOCOS film at which a pn junction is formed is decreased in particular, leakage current in this region decreases.

As described above, in the semiconductor device according to the one aspect of the present invention, a boundary layer provided at a boundary between an element isolation oxide film and a semiconductor substrate includes nitrogen atoms. Such a structure can be obtained by heat treatment of a substrate in an atmosphere of $N_2O$, $NF_3$, or the like after formation of an element isolation oxide film. By this heat treatment, the number of interstitial silicon atoms in an $SiO_x$ layer formed at a boundary between the element isolation oxide film and the semiconductor substrate decreases. In addition, unsaturated bond hands of silicon are terminated with nitrogen atoms. Therefore, leakage current of a semiconductor device is reduced, resulting in a semiconductor device with improved reliability.

In the semiconductor device according to the another aspect of the present invention, a boundary layer provided at a boundary between an oxide film and an inner wall surface of a trench includes nitrogen atoms. Such a structure can be obtained by heat treatment of a substrate in an atmosphere of $N_2O$, $NF_3$, or the like after formation of an oxide film at an inner wall surface of a trench. By this heat treatment, the number of interstitial silicon atoms in an $SiO_x$ layer formed at a boundary between the oxide film and the inner wall surface of a trench decreases. In addition, unsaturated bond hands of silicon are terminated with nitrogen atoms. Therefore, leakage current of a semiconductor device is reduced, resulting in a semiconductor device with improved reliability.

In the method of manufacturing a semiconductor device according to the still another aspect of the present invention, a semiconductor substrate is heat-treated at a temperature of 950° C. or more after formation of an element isolation oxide film. By this heat treatment, the number of interstitial silicon atoms in an $SiO_x$ layer formed at a boundary between the element isolation oxide film and the semiconductor substrate decreases. Therefore, leakage current of a semiconductor device is reduced, resulting in a semiconductor device with improved reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate;

an element isolation oxide film provided in a main surface of said semiconductor substrate for isolating an element region from the other element region;

said element isolation oxide film having a body section and a graded region which gradually decreases in thickness in a direction towards the active region;

a silicon oxide boundary layer including nitrogen atoms provided at a boundary between said graded region of said element isolation oxide film and said semiconductor substrate.

2. The semiconductor device as recited in claim 1, wherein
   said boundary layer includes nitrogen atoms of $10^{18}$–$10^{21}$ atms/cm$^3$.

3. The semiconductor device as recited in claim 1, wherein
   said boundary layer further includes fluorine atoms.

4. A semiconductor device, comprising:

a semiconductor substrate;

a trench extending into the semiconductor substrate for isolating an element region from the other element regions;

an impurity layer provided in an inner wall surface of said trench;

an oxide film provided in a bottom surface of said trench;

said oxide film having a body section and a graded region which gradually decreases in thickness in a direction toward the inner wall surface of said trench;

a silicon oxide boundary layer including nitrogen atoms provided at a boundary between said graded region of said oxide film and said semiconductor substrate.

5. The semiconductor device as recited in claim 4, wherein
   said boundary layer includes nitrogen atoms of $10^{18}$–$10^{21}$ atms/cm$^3$.

6. The semiconductor device as recited in claim 4, wherein
   said boundary layer further includes fluorine atoms.

7. A semiconductor device, comprising:

a semiconductor substrate;

an element isolation oxide film, which isolates an element region from other element regions, provided in a main surface of said semiconductor substrate;

said element isolation oxide film having a body section and a graded region which gradually decreases in thickness in a direction towards the active region; wherein the interface between said graded region of said element isolation oxide film and said semiconductor substrate contains silicon oxide and nitrogen atoms terminating unsaturated bond hands of silicon.

* * * * *

UNITED STATES PATENT AND TRADEMARK OFFICE
CERTIFICATE OF CORRECTION

PATENT NO. :   5,668,403
DATED      :   September 16, 1997
INVENTOR(S):   Tatsuya KUNIKIYO It is certified that error appears in the above-identified patent and that said Letters Patent is hereby corrected as shown below:

Column 4, line 37, should read as follows:

-- In the expressions (3) and (4), $\epsilon_t$ and $\epsilon_i$ are a trap level and--

Signed and Sealed this

Tenth Day of February, 1998

*Attest:*

BRUCE LEHMAN

*Attesting Officer*       *Commissioner of Patents and Trademarks*